United States Patent
Alsop

(10) Patent No.: US 6,489,766 B1
(45) Date of Patent: *Dec. 3, 2002

(54) PHASE INSENSITIVE PREPARATION OF SINGLE-SHOT RARE FOR DIFFUSION IMAGING

(75) Inventor: David C. Alsop, Newton, MA (US)

(73) Assignee: The Trustees of the University of Pennsylvania, Philadelphia, PA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/673,039
(22) PCT Filed: Apr. 13, 1999
(86) PCT No.: PCT/US99/08053
§ 371 (c)(1),
(2), (4) Date: Oct. 10, 2000
(87) PCT Pub. No.: WO99/53343
PCT Pub. Date: Oct. 21, 1999

Related U.S. Application Data
(60) Provisional application No. 60/081,489, filed on Apr. 13, 1998.

(51) Int. Cl.$^7$ .................................................. G01V 3/00
(52) U.S. Cl. ........................ 324/313; 324/309; 324/307
(58) Field of Search ................................ 324/309, 307, 324/300, 313, 306, 322; 600/410, 419

(56) References Cited

U.S. PATENT DOCUMENTS

| | | | |
|---|---|---|---|
| 5,327,088 A | 7/1994 | Pipe | 324/309 |
| 5,539,310 A | * 7/1996 | Basser et al. | 324/307 |
| 5,560,360 A | * 10/1996 | Filler | 128/653.2 |
| 5,684,400 A | 11/1997 | Tsukamoto et al. | 324/309 |

* cited by examiner

Primary Examiner—Edward Lefkowitz
Assistant Examiner—Brij B. Shrivastav
(74) Attorney, Agent, or Firm—Woodcock Washburn LLP

(57) ABSTRACT

A method for eliminating then on-MG component in RARE imaging that does not require a poor slice profile or discarding a substantial number of echoes (FIG. 2). This method relies upon the observation that the magnetization in each component is determined by the phase at one half of the echo time before the first refocusing pulse. A ninety degree pulse applied at this time will rotate one of the components to the longitudinal axis where it will be invisible in the subsequent sequence, (b RF). If the phase of the ninety degree pulse is the same as that of the refocusing pulses, then it will be the non-MG component that is eliminated. The combination of the tailored RF train and this ninety degree pulse permits acquisition of data from the very first echo without artifact (FIGS. 2, 4).

7 Claims, 5 Drawing Sheets

PHASE INSENSITIVE PREPARATION OF SINGLE-SHOT RARE FOR DIFFUSION IMAGING

CROSS-REFERENCE TO RELATED APPLICATIONS

This application claims priority from U.S. Provisional Application Serial No. 60/081,489, filed Apr. 13, 1998, the contents of which are hereby incorporated by reference.

GOVERNMENT SUPPORT

This invention was supported by funds from the U.S. Government (National Institute of Neurological Disorders and Stroke, grant PO1-NS08803) and the U.S. Government may therefore have certain rights in the invention.

BACKGROUND OF THE INVENTION

1. Field of the Invention

The present invention relates to diffusion imaging using a magnetic resonance imaging device and, more particularly, to a technique for modifying the RARE sequence to eliminate artifacts which relate to the strong sensitivity of multiple spin echo sequences to the phase of the prepared magnetization so that RARE may be used for diffusion and $T_2^*$ imaging.

2. Description of the Prior Art

Recent advancements in scanner hardware and pulse sequence design have made possible single excitation images of excellent quality based on multiple spin echo sequences (MSES) such as RARE and GRASE. These sequences are an attractive alternative to echoplanar imaging because they suffer much less from chemical shift artifact and distortion than echoplanar. Echoplanar imaging is frequently used for forms of functional imaging in which a preparation sensitive to physiology is applied prior to the echoplanar readout. Such an approach can, in principle, also be used to prepare MSES.

Those preparation schemes that affect longitudinal magnetization, such as magnetization transfer saturation, arterial spin tagging, inversion recovery and saturation recovery, do not affect image quality and consequently work well with MSES. However, preparation schemes that alter transverse magnetization such as $T_2$, diffusion, and $T_2^*$ preparation can result in severely degraded images because they introduce unknown phase shifts in the transverse magnetization due to motion, chemical shift or magnetic field inhomogeneity. Most MSES rely on the amplitude stability of the Carr-Purcell-Meiboom-Gill (CPMG) sequence which depends upon the Meiboom-Gill (MG) phase condition so any changes in the phase of the transverse magnetization caused by preparation will result in rapid attenuation and modulation of the echo amplitudes causing signal loss and blurring in the images.

For $T_2$ preparation, phase errors will only occur if the timing of the sequence is inaccurate or subject motion in the presence of the relatively weak crusher gradients causes phase errors. Accurate timing and moderately cooperative subjects will probably be sufficient to obtain good quality $T_2$ prepared images. $T_2$ weighting can also be obtained by appropriate phase encode order.

On the other hand, $T_2^*$ preparation will only be successful if all spins have the same chemical shift and the shim is outstanding. Though $T_2^*$ weighted images will always exhibit signal loss in voxels where the static magnetic field gradient is very large, $T_2^*$ prepared MSES images will also show severe signal loss or blurring in regions where the static magnetic field offset is large. This extra sensitivity to shim makes conventional $T_2^*$ prepared MSES imaging unattractive.

Phase errors due to motion in the presence of large magnetic field gradients are the reason for the extreme motion sensitivity of multi-shot diffusion imaging. Single-shot echoplanar imaging is frequently used for diffusion imaging to avoid these motion induced errors. However, if a phase sensitive MSES is employed for diffusion imaging, severe signal loss and attenuation will occur.

The phase sensitivity of the CPMG sequence is clearly undesirable for these applications, so ways to avoid this sensitivity must be sought. The simplest approach is to ensure that the refocusing flip angle is exactly 180°. A MSES with exactly 180° refocusing pulses is completely insensitive to phase but very small deviations from 180° are sufficient to introduce artifacts. These artifacts are caused by the presence of multiple stimulated and spin echo pathways to produce signal contribution at the echo time. For magnetization satisfying the MG phase condition, these pathways add constructively and eventually achieve a temporary steady state echo amplitude. If magnetization is 90° from the MG phase, then the pathways interact destructively causing signal amplitude decay and oscillation. In most practical applications, including multi-slice imaging where the flip angle is not uniform across the slice, the flip angle cannot be made close enough to 180° to eliminate signals from these other pathways. In long echo train applications, such as single shot imaging, it is also desirable to lower the refocusing flip angle to minimize the power deposition in the subject. The favorable properties of reduced flip angle CPMG sequences have been described by Alsop in an article entitled "The Sensitivity of Low Flip Angle RARE Imaging, " *Magn. Reson. Med.*, Vol 37, pp. 176–184 (1997) and by J. Hennig in an article entitled "Multiecho Imaging Sequences with Low Refocusing Flip Angles," *J. Magn. Reson.*, Vol. 78, pp. 397–407 (1988).

C. S. Poon et al. in an article entitled "Practical $T_2$ Quantitation for Clinical Applications," *JMRI*, Vol. 2, pp. 541–553 (1992) proposed crusher gradient schemes that can eliminate all but the primary refocused component. Unfortunately, these schemes require a large crusher amplitude that increases linearly with echo number. The added time required to apply the crusher gradients generally becomes unacceptable after only a handful of echoes. Several investigators have reported such sequences using crusher amplitudes that are too weak to fully dephase an individual voxel. These sequences employed non-selective refocusing pulses very close to 180° so the unwanted signal components are very weak. The quality of images obtained with slice selective or reduced flip angle refocusing pulses and these weaker crusher gradients would have to be evaluated. This spoiling approach has been employed to acquire. single-shot GRASE diffusion images. Because very few spin echoes and many gradient echoes were employed, the sensitivity to chemical shift and susceptibility artifacts was comparable to echoplanar. The highest quality GRASE images tend to employ many more radio frequency (RF) pulses and only a few gradient echoes. Spoiling of the CPMG sequence in this way will also cause the echo amplitudes to decrease rapidly with echo number if the refocusing pulse is reduced significantly from 180 degrees so reduction of the refocusing flip angle to lower power deposition is not possible.

A number of modifications to the CPMG sequence have been proposed to reduce errors in $T_2$ quantification or artifacts in multiple echo images by modulating the phase of the refocusing pulses. Some of these sequences can be interpreted as employing composite 180° pulses which are more insensitive to RF amplitude errors. Though these sequences work well for a few echoes when the flip angle is already near 180°, they begin to fail if the amplitude of the RF is reduced more significantly. They also usually increase the echo spacing and make single shot imaging more difficult. A two excitation method for producing phase insensitive images has also been proposed. Since the source of the phase uncertainty in diffusion imaging, motion, is not reproducible from excitation to excitation, the two shot method is not applicable.

An alternate approach to eliminating phase sensitivity of MSES sequences by crushing only some of the many stimulated and spin echo pathways has been presented by Norris et al. This approach was designed to overcome hardware limitations that precluded the precise timing and control necessary to achieve the MG phase condition. Modern clinical hardware can now readily achieve the MG condition because RARE has become an essential clinical tool. For the special applications of diffusion and $T_2^*$ prepared RARE imaging, however, this approach is still very important. A limitation of the method is the large number of echoes which must be discarded before the signal is sufficiently stable to begin phase encoding.

A refinement of the Norris et al. method is desired that permits acquisition of data from the very first echo for acquisition of diffusion images. The present invention has been developed to meet this need in the art.

SUMMARY OF THE INVENTION

The present invention relates to a modification of Multiple Spin Echo Sequences (MSES), such as RARE, Fast Spin Echo, and GRASE, which makes image quality unaffected by the initial phase of the spins. This modification makes it possible to acquire images with diffusion or $T_2^*$ contrast with a MSES. Diffusion imaging has been shown to be highly accurate at the detection of acute stroke and $T_2^*$ imaging can be useful for detection of hemorrhage and the imaging of certain tissues after the administration of contrast agents. The images resulting from this modified MSES sequence are free from the spatial distortion artifacts which plague the single excitation echoplanar images most widely used for diffusion imaging today.

In accordance with the invention, additional dephasing gradients and RF pulses are used to eliminate phase errors that are normally associated with diffusion and $T_2^*$ single-shot MSES imaging. Following standard diffusion or $T_2^*$ sequences which leave the spins pointing along the plane perpendicular to the scanner magnetic field, a MSES imaging sequence is performed with several modifications which together comprise the invention. In particular, the invention comprises the steps of:

applying a first dephasing magnetic field gradient to the sample to generate a magnetization;

applying a first radio frequency pulse to the sample which rotates the magnetization by approximately 90°, the first radio frequency pulse having a phase which is the same as a phase of refocusing pulses of a spin echo sequence to be applied to the sample;

applying at least one spin echo sequence whereby a first refocusing pulse of each spin echo sequence occurs at a time after said first radio frequency pulse which is half a time duration between successive refocusing pulses of the spin echo sequence, each spin echo sequence including:

a second dephasing magnetic field gradient applied to the sample along the same direction as the first dephasing gradient, a data acquisition period for acquiring data representative of the sample, and a second radio frequency pulse having a sign opposite the first radio frequency pulse; and generating an image of the sample from the data acquired during each data acquisition period.

BRIEF DESCRIPTION OF THE DRAWINGS

The foregoing and other novel features and advantages of the invention will become more apparent and more readily appreciated by those skilled in the art after consideration of the following description in conjunction with the associated drawings, of which:

FIG. 2 illustrates sequences for eliminating phase sensitivity in MSES, where

DETAILED DESCRIPTION OF THE PRESENTLY PREFERRED EMBODIMENTS

A preferred embodiment of the invention will now be described in detail with reference to FIGS. 1–6. Those skilled in the art will appreciate that the description given herein with respect to those figures is for exemplary purposes only and is not intended in any way to limit the scope of the invention. All questions regarding the scope of the invention may be resolved by referring to the appended claims.

Theory

Figure 1:
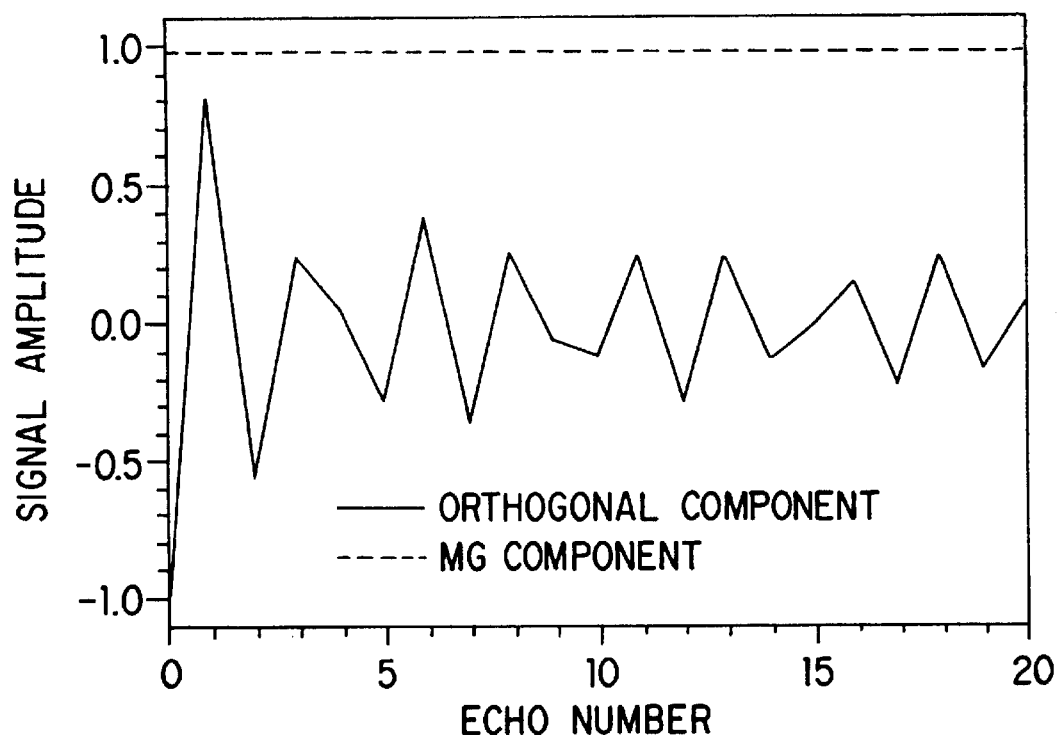
FIG. 1 illustrates the variation of the Meiboom-Gill (MG) and orthogonal phase components of the echo amplitudes in a multiple spin echo sequence (MSES).

The importance of the phase of the excited magnetization relative to the phase of the refocusing pulses in determining the amplitude of the observed echoes in a multiple spin echo sequence (MSES) has long been known. If the refocusing flip angle is not exactly 180°, the component of the magnetization along the Meiboom-Gill (MG) phase will be remarkably well refocused while the component orthogonal to this phase will be modulated and attenuated. This property has recently been related to the existence of a temporary steady state solution to the Bloch equations in the absence of $T_2$ and T1 decay which satisfies the Meiboom Gill condition. The amplitude of the RF pulses can be tailored to produce a stable MG echo amplitude from the first echo. When such an RF pulse train is applied to magnetization in the orthogonal phase, the echo amplitude rapidly oscillates and decays. Echo amplitudes from the two different components for an RF train with refocusing flip angle that asymptotically approaches 148° are shown in FIG. 1. These amplitudes were obtained from simulations of the Bloch equations as described previously in the afore-mentioned article by Alsop. $T_2$ and T1 decay were neglected. FIG. 1 illustrates the variation of the MG and orthogonal phase components of the echo amplitudes in MSES. As shown, the MG component is highly stable but the orthogonal (non MG) component drops precipitously in amplitude and oscillates wildly. An imaging sequence using this component will suffer from strong artifacts associated with this unstable echo amplitude.

When diffusion gradients are applied, motion will introduce a spatially varying phase shift. Typically, motion is sufficiently spatially coherent that the phase variation is slow compared to a voxel size. If a RARE sequence is used to image this magnetization, those voxels along the MG phase will be perfectly imaged while those with a component along the orthogonal phase will be attenuated and will cause image artifacts because of the rapid modulation of k-space amplitude and phase. The result will be an unacceptable image. In accordance with the invention, this problem is overcome by applying a dephasing gradient prior to the RARE sequence so that each voxel has equal components of MG and orthogonal phase. In addition to the dephasing gradient, rephasing gradients must be added prior to the acquisition of each echo and then rewound following acquisition to maintain the MG condition. As will be discussed below, this approach is equivalent to the "displaced U-FLARE" sequence of Norris et al. described in an article entitled "On the Application of Ultra-Fast RARE Experiments," *Magn. Reson. Med.*, Vol. 27, pp. 142–164 (1992). The displaced U-FLARE sequence suffered from modulation of echo amplitudes due to the use of constant flip angle RF pulse trains and the presence of the non MG component signal. The tailoring of the RF flip angles can readily stabilize the amplitude of the MG component. A way to eliminate the non MG component is discussed below.

Figure 2A:
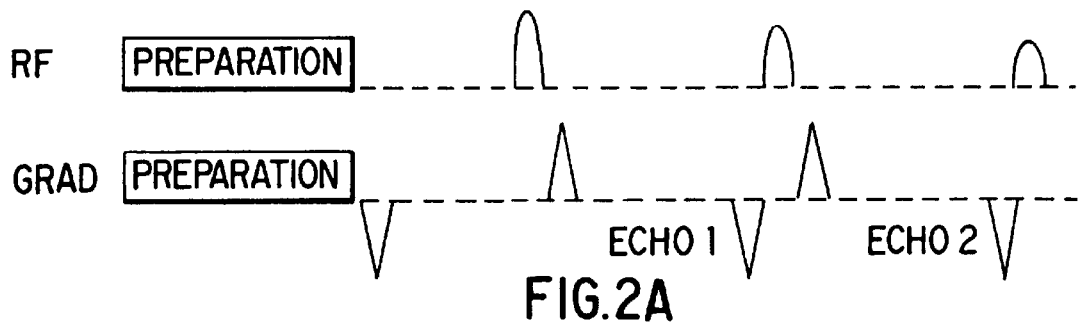
FIG. 2(a) illustrates that a dephasing gradient spreads the signal in each voxel evenly between the MG and non MG components and FIG. 2(b) illustrates the addition of a 90° pulse at one half TE before the first refocusing pulse to eliminate the non MG component.
Figure 2B:
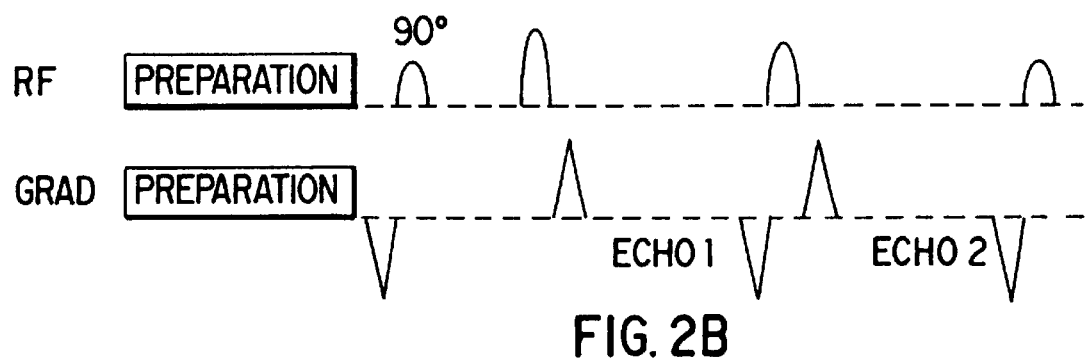

FIG. 2 illustrates sequences for eliminating phase sensitivity in MSES. FIG. 2(a) illustrates that a dephasing gradient spreads the signal in each voxel evenly between the MG and non MG components, while FIG. 2(b) illustrates the addition of a 90° pulse at one half TE before the first refocusing pulse to eliminate the non MG component. This pulse should not be confused with the excitation pulse which usually begins a MSES.

After an initial rapid decline of the signal from the non-MG component, the signal amplitude varies with an approximately sinusoidal pattern that only slowly decays. The period of the sinusoidal modulation varies linearly with the refocusing flip angle. In Norris et al., a poor refocusing slice profile is employed to accelerate the decay of the non MG component. When the flip angle varies across the slice, the different frequencies of oscillation lead to a dephasing of the signal. When the slice profile is degraded, the non-MG component is attenuated but not eliminated. Signal on the order of 10% of the image intensity can still remains after 10 echoes.

The present invention includes a method for eliminating the non-MG component that does not require a poor slice profile or discarding a substantial number of echoes. This method relies upon the observation that the magnetization in each component is determined by the phase at one half of the echo time before the first refocusing pulse. As shown in FIG. 2(b), a 90° pulse applied at this time will rotate one of the components to the longitudinal axis where it will be invisible in the subsequent sequence. If the phase of the 90° pulse is the same as that of the refocusing pulses, then it will be the non-MG component that is eliminated. The combination of a tailored RF train and this 90° pulse permits acquisition of data from the very first echo without artifact.

The dephasing of the RARE sequence reduces the signal by a factor of two. Consider the spin distribution immediately after the 90 degree pulse. The spins were spread out uniformly in the phase, f, by the dephasing pulse and then the component along the non-MG axis was removed by the 90 degree pulse. The magnetization is therefore given by $$M_x = \cos\varphi = \frac{e^{i\varphi} + e^{-i\varphi}}{2} \quad [1]$$

where $M_x$ is the magnetization along the MG phase direction and f represents the phase added to the magnetization by the dephasing gradient, which is rapidly varying within a single voxel. Prior to acquiring the echoes, a second dephasing pulse is applied with opposite magnitude causing the magnetization to change, $$M_x^{echo} = \frac{1}{2} + \frac{e^{-2i\varphi}}{2} \quad [2]$$

The second term averages to zero within the voxel so only half of the original magnetization is imaged.

The dephasing gradients can be applied in any of the three directions. The choice of the direction depends on the dimensions of the voxel and the other functions served by the gradients along that direction. In typical imaging protocols, the slice thickness is greater than the in-plane pixel dimensions and dephasing of the spins is easier along the slice direction. For this reason, the slice direction is typically used for the crusher gradients. These crusher gradients cause the signal at the echo time to consist of a number of components only one of which is visible. The signal of a spin isochromat can be expanded as $$M = \sum_{n=-echo\ number}^{echo\ number} a_n \exp(in\theta) \quad [3]$$

where q is the phase imparted by a pair of crusher gradients plus contributions from frequency offsets and chemical shift. If the dephasing gradient is also applied along the slice direction, then the phase imparted by the dephasing gradient, f, will have the same spatial dependence and the signal at the echo time will be $$M = \sum_{n=-echo\ number}^{echo\ number} \frac{a_n \exp(in\theta)}{2} + \frac{a_n \exp(-in\theta - 2i\varphi)}{2} \quad [4]$$

Unless q is substantially larger than f, additional artifact producing signals may be observed because nq minus if can be close to zero for some n. If the slice thickness is only two or three times the in plane resolution, as in this application, applying the dephasing gradient along the slice direction is not specially advantageous and it increases the already heavy usage of the slice direction gradient.

Application of the dephasing gradient along the frequency encode direction makes possible an interpretation of the dephasing as a division of the signal into two echoes. Either of the two components of Equation [1] can be rephased. If the dephasing gradient is applied along the frequency direction, both components can be observed by leaving the readout gradient on after acquiring the first component.

Separate phase encoding of the two echoes has been proposed to speed RARE acquisitions. Since a single echo could be acquired with at least twice the bandwidth within the same time, there is no intrinsic signal-to-noise ratio improvement by sampling both echoes. The displaced U-FLARE sequence of Norris et al. uses a dephasing gradient along the frequency direction. This sequence appears to lack both the initial dephasing gradient and the rewinding gradient of FIG. 2. The similarity between the two sequences can be seen by recognizing that additional frequency direction crusher gradients can be applied symmetrically around the refocusing pulses without changing the properties of the sequence. To implement the 90° pulse to eliminate the MG component within the displaced U-FLARE sequence would require dephasing the spins, applying the 90° pulse and then rephasing the spins.

In the current implementation, the dephasing gradient is applied along the phase direction. This has the advantage that the prephasing gradient applied along the readout direction, which centers the echo in the readout gradients, also can act as a crusher for the sequence. No crusher gradients are applied along the phase direction.

Imaging Methods

Figure 3:
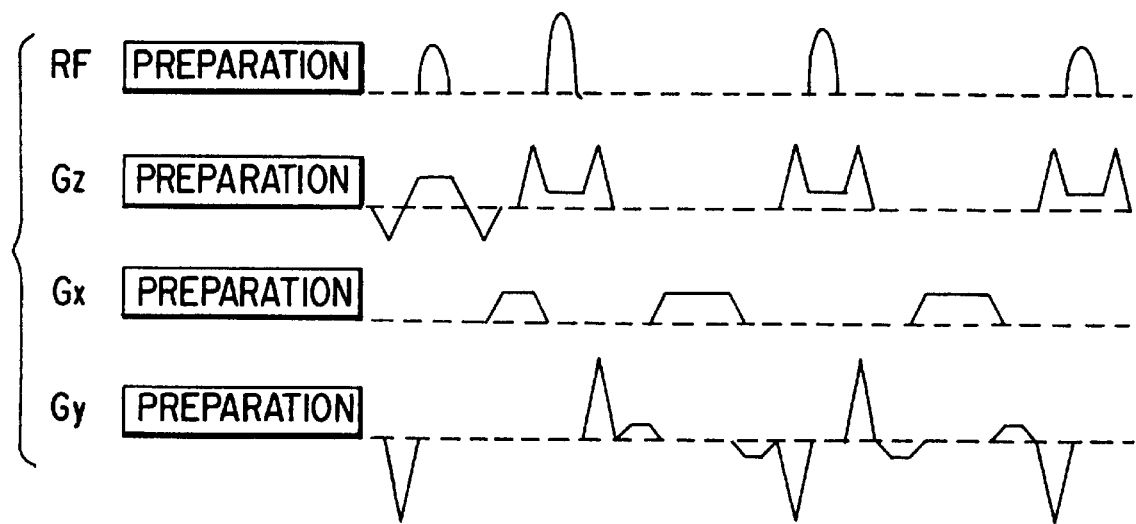
FIG. 3 illustrates the phase insensitive pulse sequence employed for imaging using the method of the invention.

FIG. 3 illustrates the phase insensitive pulse sequence employed for imaging using the method of the invention. Only the first two echoes are shown; the subsequent echoes are identical except for phase encoding and RF amplitude. Prephasing of the slice gradient is necessary prior to the 90° pulse to ensure it properly rotates the non-MG component to the longitudinal plane. The preparation period must produce transverse magnetization. The pulse sequence of FIG. 3 is identical to the low flip angle RARE sequence previously described except for the presence of the following: the preparation period, the large dephasing gradients in the phase direction applied before the 90 degree pulse and before and after each echo, a prephasing pulse in the slice direction designed to cancel the first half of the slice selection gradient, and a rotation in phase of the 90 degree pulse by 90 degrees. The functions of these changes were discussed above.

The phase insensitive RARE sequence of the invention was implemented on a 1.5 T GE SIGNA scanner equipped with a prototype gradient system for fast imaging. The phase encoding and dephasing pulses, which are shown separately in FIG. 1 for clarity of purpose, were merged in the actual sequence. In all other respects the sequence was identical to the one described in the afore-mentioned Alsop article. An RF train with an asymptotic flip angle of sixty degrees and two echo ramp was employed. The first five refocusing flip angles of the RF pulse train were 142.2°, 94.9°, 69.2°, 63.0° and 60.2° with the subsequent flip angles all very close to 60°. Though the higher amplitude of the first two echoes could potentially be corrected during reconstruction, they were discarded in this study and centric phase encoding began with the third echo. The sequence was limited to a phase encode dimension of 64 by an artificial software restriction but the phase direction field of view was reduced to 62.5% of the frequency direction to enhance the phase direction resolution. A frequency direction resolution of 128 and an acquisition bandwidth of ±32 kHz were chosen. Fields of view between 24 and 28 cm and slice thicknesses between 5 and 8 mm were evaluated. The resulting echo spacings were between 5.1 and 5.3 ms. Though the scanner was capable of a gradient switching speed of 230 mTm$^{-1}$ms$^{-1}$, near the peripheral nerve stimulation threshold, operating at only 77 mTm$^{-1}$ms$^{-1}$ increased the echo spacing by only 5% and had little impact on image quality.

Diffusion sensitization was accomplished with a standard Stejskal Tanner sequence with a pulse duration, d, of 35 ms, an inter pulse spacing of 6 ms and a gradient amplitude of 21 mT/m which corresponds to a b value of 1134 s/mm$^2$ neglecting imaging gradients and switching time. The timing of the diffusion preparation was selected so the spin echo would occur at the center of the 90 degree pulse of the phase insensitive RARE sequence. Images were acquired with diffusion gradients applied in each of three directions as well as with very weak diffusion gradients to serve as reference. The effective TE of the zero phase encode was 104 ms. Raw echo data were stored and transferred to a workstation for reconstruction and analysis.

Though each excitation produced a single diffusion image, magnitude averaging of multiple images was performed to decrease noise and permit more careful evaluation of image quality. Images were acquired with a TR of 2 seconds and the three diffusion and reference images were acquired interleaved in time to minimize any motion that might occur between the different images. A directionally averaged diffusion image was generated by taking the cube root of the product of the three directional images. This angular averaged image is determined by the trace of the diffusion tensor as can be seen by the following equation.

$$\rho \exp\left(-\frac{b}{3}(D_{xx} + D_{yy} + D_{zz})\right) = \qquad [5]$$
$$((\rho\exp(-bD_{xx}))(\rho\exp(-bD_{yy}))(\rho\exp(-bD_{zz})))^{-1/3}$$

where r is the magnetization density and $D_{xx}$, $D_{yy}$ and $D_{zz}$ are the diagonal components of the diffusion tensor.

The sequence was evaluated in a phantom, two normal volunteers and one patient. The patient was a 75 year old man with multiple stroke risk factors who developed right sided visual loss, right hemiparesis, right hemisensory loss and aphasia following a surgical. procedure. Diffusion imaging was performed 48 hours following the onset of symptoms.

Results

Figure 4:
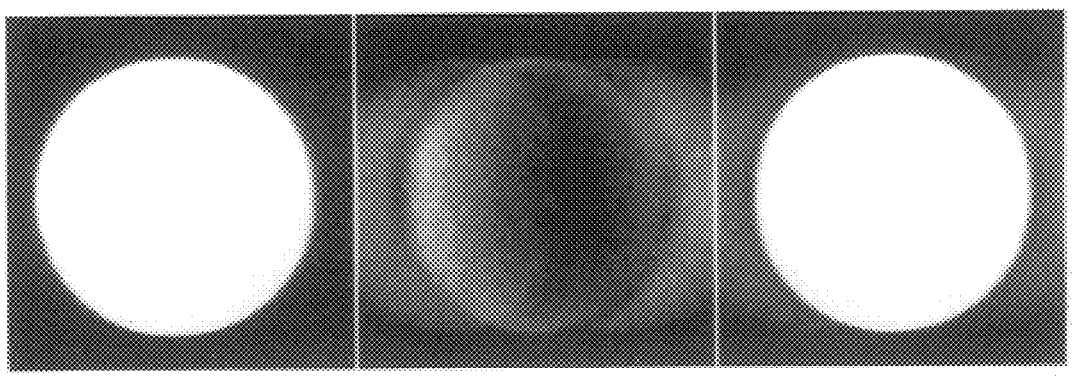
FIG. 4 illustrates phantom images demonstrating the effect of the 90° pulse at eliminating the non MG component.

The effectiveness of the pulse sequence of the invention has been demonstrated in a phantom. FIG. 4 illustrates phantom images demonstrating the effect of the 90° pulse at eliminating the non MG component. As shown on the left of FIG. 4, a diffusion weighted image obtained with the 90° pulse applied at the same phase as the refocusing pulses is free from artifact. Rotation of the 90° pulse phase by 90° produces an image of the non MG component, as shown in the center of FIG. 4. If the 90° pulse is not employed, the non MG component shows much weaker intensity and ghost artifact comparable in magnitude to the image, as shown on the right of FIG. 4. An image obtained with the 90° pulse turned off demonstrates the artifact introduced by the non-MG component.

Figure 5:
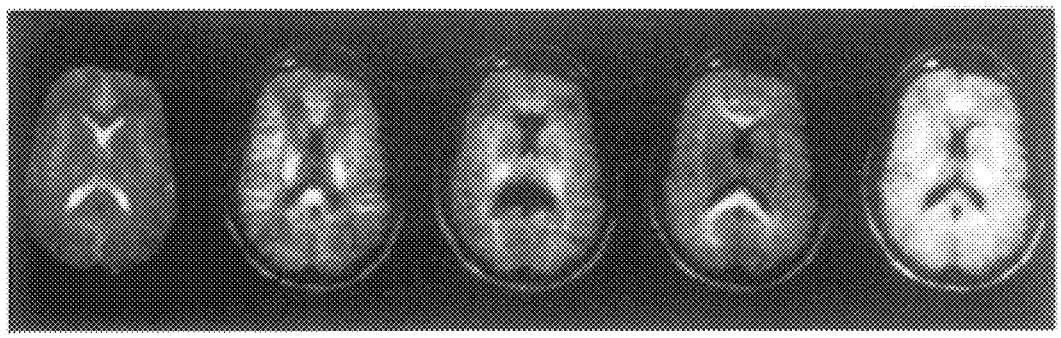
FIG. 5 illustrates axial diffusion images of a normal volunteer acquired with single-shot RARE.

FIG. 5 illustrates axial diffusion images of a normal volunteer acquired with single-shot RARE. Each image represents the magnitude average of 6 single-shot images. Images were acquired with, from left to right, no diffusion weighting, diffusion gradients applied in the left-right direction, anterior-posterior direction and then superior-inferior direction. The rightmost images are angular average images calculated from the three directional images. All diffusion images employed a diffusion weighting of 1134 s mm$^{-2}$.

As shown in FIG. 5, diffusion weighted images in normal subjects showed diffusion related attenuation but were free from artifact. Anisotropy of white matter was readily apparent in the images acquired with different diffusion directions, consistent with previous reports. In the angular average images calculated from the three directional images the white matter was much more uniform in intensity. The angular average images were free from artifact associated with image shifts between the directional images. Such image shifts frequently appear in echoplanar images because of the very narrow effective bandwidth of the acquisition.

Figure 6:
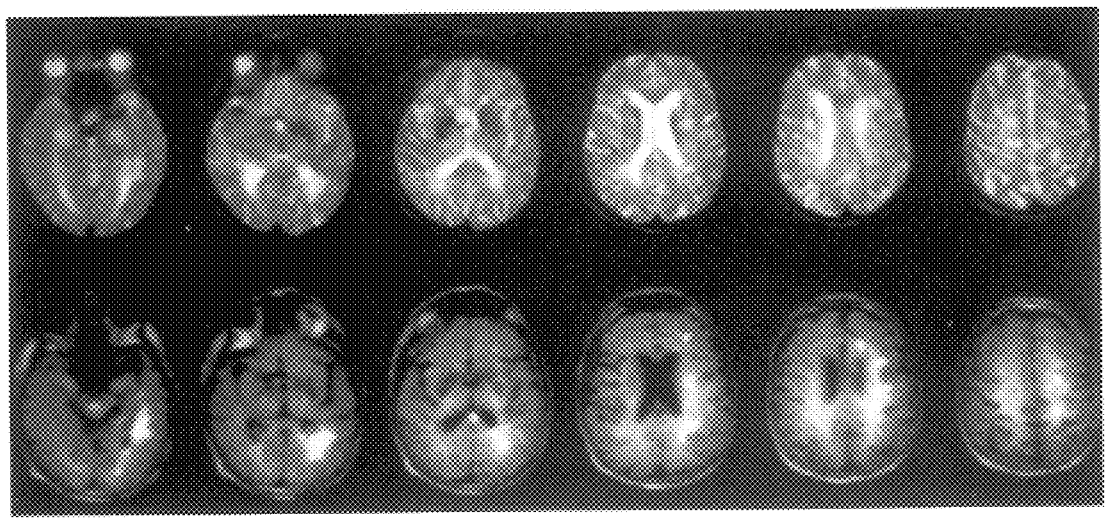
FIG. 6 illustrates angular average diffusion images from six axial slices in a patient with stroke symptoms, where the upper row was acquired with zero diffusion weighting and the lower row is an angular average of diffusion images acquired in the three directions.

FIG. 6 illustrates angular average diffusion images from six axial slices in a patient with stroke symptoms, where the upper row was acquired with zero diffusion weighting and the lower row is an angular average of diffusion images acquired in the three directions. Eight averages were used for each direction prior to calculating the angular average image. A primary subcortical lesion within the left occipital and temporal lobes as well as multiple small foci distributed throughout the white matter of the left hemisphere are apparent. Though abnormalities are also apparent on the standard clinical $T_2$ weighted images, they are much less prominent. The location of the larger lesion is consistent with the clinical symptoms.

Discussion

The phase-insensitive RARE pulse sequence of the invention can produce images of clinical quality that are highly insensitive to motion. The use of tailored RF pulse trains and a 90° pulse to remove the non-MG component were essential to achieving stable echo amplitudes that could produce artifact free images. Preparation of the sequence with diffusion gradients produced high quality diffusion images in both normal volunteers and a patient that were free from the distortion and chemical shift artifacts that are a frequent problem in echoplanar imaging. Because single-shot MSES are less demanding of hardware than echoplanar, prepared MSES will be more accessible to the clinical community.

The utility of single-shot MSES imaging will depend in part on the signal-to-noise ratio in comparison to echoplanar or other imaging sequences. In the absence of magnetic field inhomogeneity and chemical shift differences, an echoplanar acquisition can be as long as a spin echo acquisition with 180° flip angles. Since the presented approach to avoiding phase related artifacts in MSES reduces the signal by a factor of two, the MSES diffusion sequence would clearly be inferior. In practice, echoplanar images acquired on the time scale of $T_2$ are severely degraded by distortion artifact in many parts of the brain. It has been suggested that interleaved echoplanar is necessary to obtain clinical quality diffusion images even with fast gradient systems. Interleaving decreases the effective readout duration and consequently the signal-to-noise ratio per unit time and also dramatically increases the motion sensitivity. The RARE sequence of the invention employs a frequency direction readout of 2 ms so the sensitivity to chemical shift and distortion is more than an order of magnitude lower than echoplanar. The excellent image quality obtained without special shimming is clearly advantageous. In other parts of the body where the magnetic field inhomogeneity can be much worse, MSES diffusion may have a greater advantage.

Those skilled in the art will appreciate that imaging times almost four times longer than the $T_2$ of the tissue may be employed using the techniques of the invention. While $T_2$ decay during the echo train can lead to blurring of the image, resolution does not appear severely degraded when the technique of the invention is employed. This can partially be attributed to the increase in the effective $T_2$ of the tissue due to stimulated echo components when the refocusing flip angle is low. Simulations indicate that the effective $T_2$ of tissue is approximately doubled for a 60° flip angle RF train. A second reason for the preserved resolution of the images is that the $T_2$ decay acts partially as a windowing function that reduces ringing artifact near edges and actually helps to confine the point spread function. $T_2$ decay must necessarily cause some loss of resolution and care must be taken when choosing long RF trains.

Another issue that arises in comparing MSES with echoplanar, is the time required to acquire an image. The image acquisition time for the images acquired above was 360 ms, considerably longer than the 64 to 100 ms necessary for echoplanar imaging. The added acquisition time could reduce the number of slices that can be acquired in a short time. Use of fractional k-space acquisition would reduce the RARE acquisition to only 150 ms. Since the diffusion preparation requires almost 100 ms, the total diffusion imaging time becomes only 250 ms, allowing the acquisition of four slices per second. In practice, many commercial scanner gradient systems would overheat with this many diffusion pulses per second, so the imaging time is not an excessive burden.

The images in FIGS. 5 and 6 were obtained by magnitude averaging multiple single-shot images. Though this increases the total imaging time, the improved signal-to-noise ratio makes it possible to more carefully assess image quality. In applications like imaging of acute stroke, where the lesion contrast is high and the patients may not be cooperative, shorter imaging times may be acceptable, though magnitude averaging over two minutes in hyperacute stroke patients has been reported. In other patients, who can often cooperate through more motion sensitive multi-shot scans that can require over 5 minutes to acquire, averaging may be advantageous. The resolution selected for this study was selected based on previous echoplanar diffusion studies and the need to achieve a good signal-to-noise ratio. However, thinner slices and higher resolution are readily achievable with single-shot RARE. If desired, images with resolution comparable to standard clinical $T_2$ scans could be obtained but further averaging would be required to increase the signal-to-noise ratio.

Those skilled in the art will appreciate that numerous other modifications to the invention are possible within the scope of the invention. Accordingly, the scope of the invention is not intended to be limited to the preferred embodiments described above, but only by any appended claims.

I claim:

1. A phase insensitive method for generating a magnetic resonance image of a sample, the method comprising the steps of:

applying a first dephasing magnetic field gradient to the sample to generate a magnetization;

applying a first radio frequency pulse to the sample which rotates the magnetization by approximately 90°, the first radio frequency pulse having a phase which is the same as a phase of refocusing pulses of a spin echo sequence to be applied to the sample;

applying at least one spin echo sequence whereby a first refocusing pulse of each spin echo sequence occurs at a time after said first radio frequency pulse which is half a time duration between successive refocusing pulses of the spin echo sequence, each spin echo sequence including:

a second dephasing magnetic field gradient applied to the sample along the same direction as the first dephasing gradient, a data acquisition period for acquiring data representative of the sample, and a second radio frequency pulse having a sign opposite the first radio frequency pulse; and generating an image of the sample from the data acquired during each data acquisition period.

2. The method of claim 1, wherein the step of generating the image includes the step of generating the image as a plurality of voxels, and wherein the step of applying the first dephasing magnetic field gradient includes applying the first dephasing magnetic field gradient so that each voxel has equal components of Meiboom-Gill and orthogonal phase.

3. The method of claim 1, comprising the further step of preparing the sample for diffusion imaging.

4. The method of claim 1, comprising the further step of preparing the sample for $T_2^*$ imaging.

5. A system for generating a magnetic resonance image of a sample, the system comprising:
   a magnetic field generator that applies a first dephasing magnetic field gradient to the sample to generate a magnetization;
   a radio frequency generator that applies a first radio frequency pulse to the sample which rotates the magnetization by approximately 90°, the first radio frequency pulse having a phase which is the same as a phase of refocusing pulses of a spin echo sequence to be applied to the sample;
   a processor, connected to the magnetic field generator and to the radio frequency generator, that causes at least one spin echo sequence to be generated by said magnetic field generator and radio frequency generator whereby a first refocusing pulse of each spin echo sequence occurs at a time after said first radio frequency pulse which is half a time duration between successive refocusing pulses of the spin echo sequence, each spin echo sequence including:
      a second dephasing magnetic field gradient applied to the sample along the same direction as said first dephasing gradient,
      a data acquisition period for acquiring data representative of the sample, and
      a second radio frequency pulse having a sign opposite the first radio frequency pulse; and
   a magnetic resonance imaging device that generates an image of the sample from the data acquired during each data acquisition period.

6. A pulse sequence for application to a magnetic resonance imaging device for imaging a sample, the pulse sequence comprising:
   a first dephasing magnetic field gradient which is applied to the sample and generates a magnetization;
   a first radio frequency pulse which is applied to the sample and rotates the magnetization by approximately 90°, the first radio frequency pulse having a phase which is the same as a phase of refocusing pulses of a spin echo sequence to be applied to the sample; and
   a plurality of spin echo sequences, wherein each said spin echo sequence is applied to the sample whereby a first refocusing pulse of each spin echo sequence occurs at a time after said first radio frequency pulse which is half a time duration between successive refocusing pulses of said spin echo sequence, each said spin echo sequence including:
      a second dephasing magnetic field gradient which is applied to the sample along the same direction as said first dephasing gradient, and
      a second radio frequency pulse having a sign opposite the first radio frequency pulse.

7. The pulse sequence of claim 6, wherein each said spin echo sequence further includes a data acquisition period between said second dephasing magnetic field gradient and said second radio frequency pulse for acquiring data representative of the sample.

* * * * *